United States Patent [19]

Williams

[11] 4,097,827
[45] Jun. 27, 1978

[54] CONSTANT IMPEDANCE, CONSTANT PHASE PIN DIODE WITH ATTENUATOR

[75] Inventor: Mark R. Williams, West Melbourne, Fla.

[73] Assignee: The United States of America as represented by the Secretary of the Air Force, Washington, D.C.

[21] Appl. No.: 765,711

[22] Filed: Feb. 4, 1977

[51] Int. Cl.² .................................... H03H 7/24
[52] U.S. Cl. ........................... 333/81 R; 333/81 A
[58] Field of Search ............... 333/81 R, 81 A, 81 B; 323/79-81

[56] References Cited

U.S. PATENT DOCUMENTS

| | | | |
|---|---|---|---|
| 3,325,754 | 6/1967 | Frisch et al. | 333/81 R |
| 3,453,564 | 7/1969 | Russell | 333/81 R |
| 3,518,585 | 6/1970 | Wilcox | 333/81 R |
| 3,859,609 | 1/1975 | Couvillon et al. | 333/81 A |
| 4,010,430 | 3/1977 | Wolfe | 333/81 A |

*Primary Examiner*—Paul L. Gensler
*Attorney, Agent, or Firm*—Joseph E. Rusz; George Fine

[57] ABSTRACT

A constant impedance, constant phase PIN diode attenuator uses PIN diodes in a double pi configuration. A control voltage is applied simultaneously thereto thus attaining 40 dB attenuation without substantially varying phase and amplitude characteristics.

3 Claims, 1 Drawing Figure

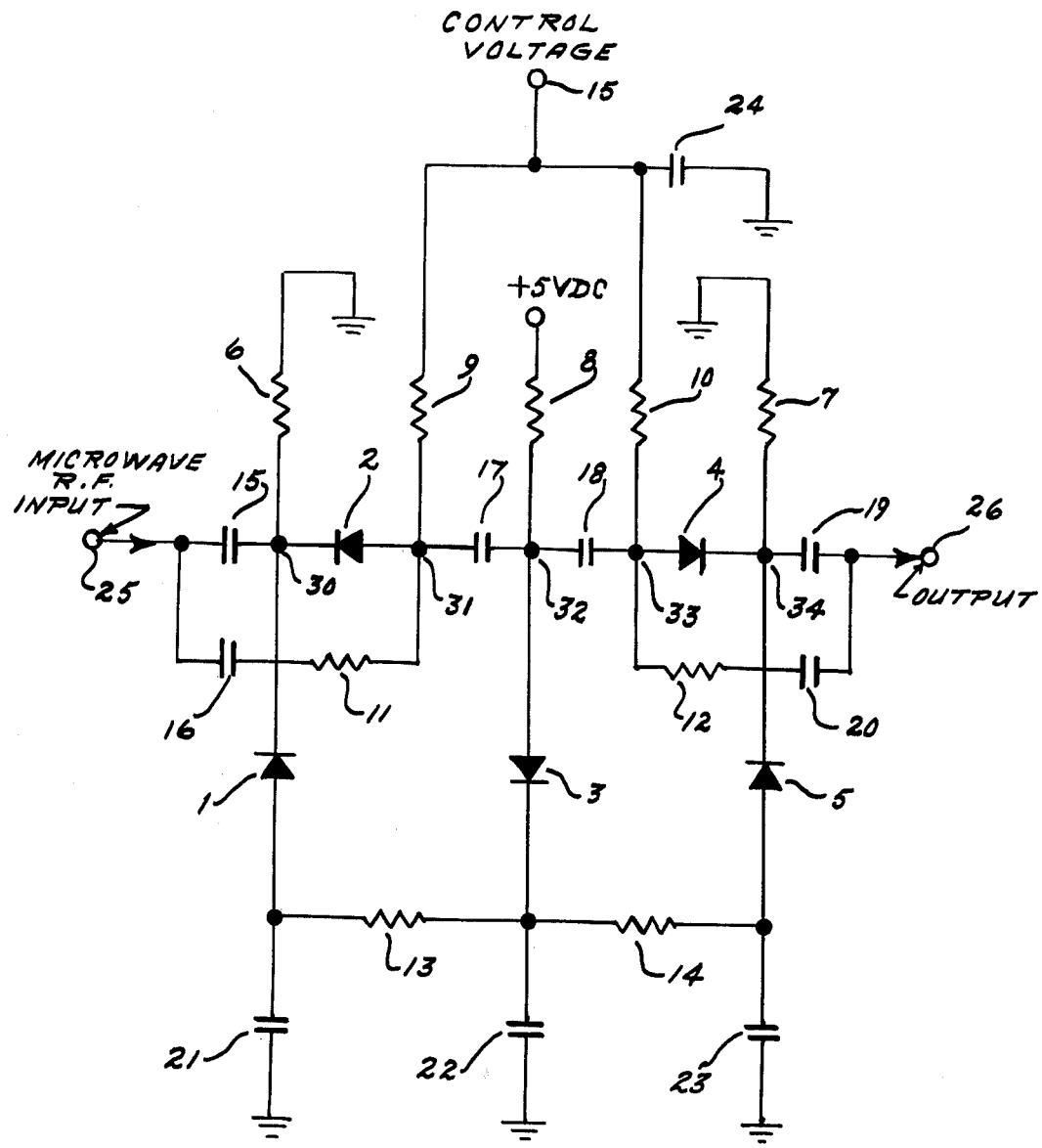

CONSTANT IMPEDANCE, CONSTANT PHASE PIN DIODE WITH ATTENUATOR

STATEMENT OF GOVERNMENT INTEREST

The invention described herein may be manufactured and used by or for the Government for Governmental purposes without the payment of any royalty thereon.

BACKGROUND OF THE INVENTION

The PIN diode current controlled resistor is especially useful at high frequencies. The long carrier lifetime of these diodes makes them act as pure resistances to RF signals while remaining normal diodes to DC. Intermods are theoretically nonexistent at frequencies well above cut-off because the devices are no longer square law. A PIN diode attenuator, then would be especially desirable at higher frequencies such as in the region of 300 MHz. However, a single conventional PIN diode attenuator causes the phase to be shifted almost 80° at maximum attenuation. The effects of a phase shift with attenuation can be detrimental. To keep the phase shift to a minimum and increase attenuation, a novel double $\pi$ was devised. The phase shift with attenuation was kept at a minimum over the range of 0 to 40 dB attenuation.

SUMMARY OF THE INVENTION

A constant impedance, constant phase PIN diode attenuator is provided. The diodes are arranged in a double pi pad arrangement. Resistors are connected in parallel to the series diodes of the pad to provide the resistance value necessary for the desired amount of attenuation and to limit the phase shifting effects of the diode junction capacitance on the total impedance. A control voltage is applied simultaneously to the double pi pad arrangement for varying the attenuation.

DESCRIPTION OF THE DRAWING

In the single FIGURE of the invention there is shown a schematic for the constant impedance, constant phase PIN diode attenuator.

DETAILED DESCRIPTION OF THE PREFERRED EMBODIMENT

The single FIGURE shows in schematic form the circuit which makes use of the fact that the PIN diode acts like a variable resistor at frequencies above approximately 100 MHz while compensating for the detrimental effects of the diode junction capacitance on phase with a resistor in shunt with the series diode. The RF resistance of the PIN diode is dependent upon the bias current, with typical resistance varying from approximately 10,000 ohms at 0 mA to 1 ohm or less at 30 mA bias.

The diodes are arranged in a double $\pi$ pad arrangement which is two pads sharing diode 3. It is noted junctions 30–34 are used as tie points. Input terminal 25 receives an RF signal and output terminal 26 provides the variable attenuated signal. Half of the attenuator, the left side, simplifies the bias description. There are actually two DC current loops, one through resistor 9 and diode 2, the other through resistor 8, diode 3, and diode 1. Both loops share resistor 6. In the "off" state, the control voltage at terminal 15 is 0 and diode 2 is back-biased, having a value of 10 K ohms. Resistor 11 in parallel with diode 2 gives the effective resistance value necessary for a 20 dB pad, thus limiting the effect of the junction capacitance of the diode on the total impedance. This keeps the phase shift due to the shunt RC combination to a minimum. Resistor 8 and resistor 9 set the current through diode 1 and diode 3 for the proper 20 dB pad shunt values. As voltage is applied to the control voltage point, current flows through diode 2 and more voltage is dropped across resistor 6, effectively reducing the bias of diode 1 and diode 3. This causes diode 2 to decrease in resistance and diode 1 and diode 3 to increase. Finally, as the control voltage increases, the drop across resistor 6 is so large that diode 1 and diode 3 are back-biased and are effectively 10 K ohms each. Diode 2 is approximately 12 ohms at this point. For the combined double $\pi$, the current through diode 3 is always twice that through diode 1 and diode 5. The two sections (left and right) are limited to 20 dB attenuation per section by resistor 11 and resistor 12, which is mentioned, keeps the phase shift low by keeping the shunt RC impedance highly resistive.

Resistors 9, 10, 13 and 14 are for RF isolation. The values of resistors 6, 7, and 8 must be calculated for the particular PIN diodes to be used. This may be aided by graphs of diode RF resistance versus bias current. The values for resistors and capacitors for HP 8052-0012 PIN diode chips are as follows: for capacitors 15-24, each one is 100 pF; for resistors 6 and 7, each is 6.7 K ohms; for resistor 8, the value is 14.2 K ohms; for resistors 9 and 10, each value is 1 K ohms; for resistors 11 and 12, each value is 306 ohms; and the value for each of resistors 13 and 14 is 100 ohms.

What is claimed is:

1. A constant impedance, constant phase PIN diode variable attenuator being comprised of a first PIN diode pi pad, having a RF input terminal, a second PIN diode pi pad having an output terminal and in series with said first PIN diode pi pad, said first and second PIN diode pi pads comprising three diodes each and sharing a common diode, and a control voltage applied simultaneously to said first and second PIN diode pi pads for variation of attenuation thereof.

2. A constant impedance, constant phase PIN diode variable attenuator as described in claim 1 wherein said first PIN diode pi pad is comprised of a first diode, second diode, and said command diode, each of said diodes having a cathode and anode, a first junction, said cathodes of said first and second diodes being connected to said first junction, a first capacitor interconnecting said RF input terminal and said first junction, a first resistor interconnecting ground and said first junction, a second capacitor interconnecting ground and said anode of said first diode, a second junction, a third capacitor in series with a second resistor interconnnecting said RF input terminal and said second junction, a third resistor interconnecting said control voltage and said second junction, said anode of said second diode being connected to said second junction, a fixed DC voltage third junction, a fourth resistor connecting said fixed DC voltage to said third junction, a fourth capacitor interconnecting said second junction and said third junction, said anode of said common diode being connected to said third junction, a fifth capacitor connecting said cathode of said common diode to ground, and a fifth resistor connected between said anode of said first diode and said cathode of said common diode.

3. A constant impedance, constant phase PIN diode variable attenuator as defined in claim 2 wherein said second PIN diode pi pad is comprised of a third diode, a fourth diode, and said common diode, each having a cathode and anode, said first and second PIN diode pi pads also further sharing said fixed DC voltage, said fourth resistor, said third junction and said fifth capacitor, a fourth junction, a sixth capacitor interconnecting said third and fourth junctions, a sixth resistor connecting said control voltage to said fourth junction, a seventh resistor and a seventh capacitor in series interconnecting said fourth junction and said output terminal, a fifth junction, said third diode interconnecting said fourth and fifth junctions, an eighth resistor connecting said fifth junction to ground, an eighth capacitor connecting said fifth junction to said output terminal, said cathode of said fourth diode being connected to said fifth junction, a ninth capacitor interconnecting said anode of said fourth diode to ground, a ninth resistor interconnecting said cathode of said common diode to said anode of said fourth diode, a tenth capacitor connecting said control voltage to ground.

* * * * *